United States Patent
Matsumoto et al.

(10) Patent No.: US 11,164,726 B2
(45) Date of Patent: Nov. 2, 2021

(54) GAS SUPPLY MEMBER, PLASMA PROCESSING APPARATUS, AND METHOD FOR FORMING COATING FILM

(71) Applicant: Toshiba Memory Corporation, Minato-ku (JP)

(72) Inventors: Tetsuyuki Matsumoto, Yokkaichi (JP); Makoto Saito, Yokkaichi (JP); Hisashi Hashiguchi, Mizuho (JP)

(73) Assignee: Toshiba Memory Corporation, Minato-ku (JP)

( * ) Notice: Subject to any disclaimer, the term of this patent is extended or adjusted under 35 U.S.C. 154(b) by 128 days.

(21) Appl. No.: 16/511,169

(22) Filed: Jul. 15, 2019

(65) Prior Publication Data
US 2020/0258719 A1    Aug. 13, 2020

(30) Foreign Application Priority Data
Feb. 8, 2019    (JP) .............................. JP2019-021604

(51) Int. Cl.
*H01J 37/32*        (2006.01)
*C23C 16/455*       (2006.01)
*C23C 16/44*        (2006.01)

(52) U.S. Cl.
CPC ...... *H01J 37/3244* (2013.01); *C23C 16/4404* (2013.01); *C23C 16/45565* (2013.01); *H01J 37/32798* (2013.01)

(58) Field of Classification Search
CPC ............. H01J 37/3244; H01J 37/32798; H01J 37/32091; C23C 16/45565; C23C 16/4404
See application file for complete search history.

(56) References Cited

U.S. PATENT DOCUMENTS

| 10,755,900 B2* | 8/2020 | Tran .................... C23C 16/0254 |
| 2006/0073354 A1 | 4/2006 | Watanabe et al. |
| 2012/0037596 A1 | 2/2012 | Eto et al. |
| 2012/0040132 A1* | 2/2012 | Eto ........................ C22C 21/00 428/131 |
| 2012/0247673 A1 | 10/2012 | Hayashi et al. |

(Continued)

FOREIGN PATENT DOCUMENTS

| JP | 2006-186306 | 7/2006 |
| JP | 2012-060101 | 3/2012 |

(Continued)

*Primary Examiner* — Jeffrie R Lund
(74) *Attorney, Agent, or Firm* — Oblon, McClelland, Maier & Neustadt, L.L.P.

(57) ABSTRACT

A gas supply member according to an embodiment includes: a base material that has a gas flow path capable of flowing a gas from an upstream side to a downstream side, a main surface arranged on the downstream side of the gas flow path in a direction intersecting an extending direction of the gas flow path, and a discharge port connecting the gas flow path and the main surface; and a film that contains at least one of yttria, yttrium oxyfluoride, yttrium fluoride, alumina, and aluminum nitride and covers the main surface and a surface of the discharge port of the base material. The film covers the main surface and the surface of the discharge port such that a surface of the film does not have a surface orientation portion of which a normal intersects a normal of the main surface at 45° to 75°.

17 Claims, 5 Drawing Sheets

(56) References Cited

U.S. PATENT DOCUMENTS

| | | | |
|---|---|---|---|
| 2014/0231251 A1* | 8/2014 | Hashiguchi | C23C 16/5096 |
| | | | 204/298.33 |
| 2016/0010200 A1* | 1/2016 | Mitsuhashi | H01J 37/32633 |
| | | | 427/456 |
| 2017/0243777 A1 | 8/2017 | Ohashi et al. | |
| 2018/0330923 A1* | 11/2018 | Tran | C23C 16/45565 |
| 2020/0224096 A1* | 7/2020 | Andreaus | H01L 21/30604 |
| 2020/0258719 A1* | 8/2020 | Matsumoto | H01J 37/32091 |
| 2020/0354827 A1* | 11/2020 | Ko | C23C 14/5806 |

FOREIGN PATENT DOCUMENTS

| | | | |
|---|---|---|---|
| JP | 2012-216823 | | 11/2012 |
| JP | 2013-084997 | | 5/2013 |
| JP | 2013084997 A | * | 5/2013 |
| JP | 2017-022356 | | 1/2017 |
| JP | 2017-152437 | | 8/2017 |
| WO | WO 2019/109207 A1 | * | 6/2019 |

* cited by examiner

GAS SUPPLY MEMBER, PLASMA PROCESSING APPARATUS, AND METHOD FOR FORMING COATING FILM

CROSS-REFERENCE TO RELATED APPLICATIONS

This application is based upon and claims the benefit of priority front Japanese Patent Application No. 2019-021604, filed on Feb. 8, 2019; the entire contents of which are incorporated herein by reference.

FIELD

Embodiments described herein relate generally to a gas supply member, a plasma processing apparatus, and a method for forming a coating film.

BACKGROUND

In plasma processing apparatuses processing a substrate, a gas supply member that supplies a gas for plasmatization is used. There is a case where a surface of a base material of the gas supply member is covered and protected with a coating film, for example, an yttria film or the like, in order to suppress consumption of the gas supply member by plasma. There is a demand for improvement of protection performance in the coating film.

DETAILED DESCRIPTION

A gas supply member according to an embodiment includes: a base material that has a gas flow path capable of flowing a gas from an upstream side to a downstream side, a main surface arranged on the downstream side of the gas flow path in a direction intersecting an extending direction of the gas flow path, and a discharge port connecting the gas flow path and the main surface; and a film that contains at least one of yttria, yttrium oxyfluoride, yttrium fluoride, alumina, and aluminum nitride and covers the main surface and a surface of the discharge port of the base material. The film covers the main surface and the surface of the discharge port such that a surface of the film does not have a surface orientation portion of which normal intersects a normal of the main surface at 45° to 75°.

Hereinafter, the present invention will be described in detail with reference to the drawings. Incidentally, the present invention is not limited to the following embodiment. In addition, constituent elements in the following embodiment include those that can be easily assumed by those skilled in the art or those that are substantially the same.

Example of Configuration of Plasma Processing Apparatus

Figure 1:
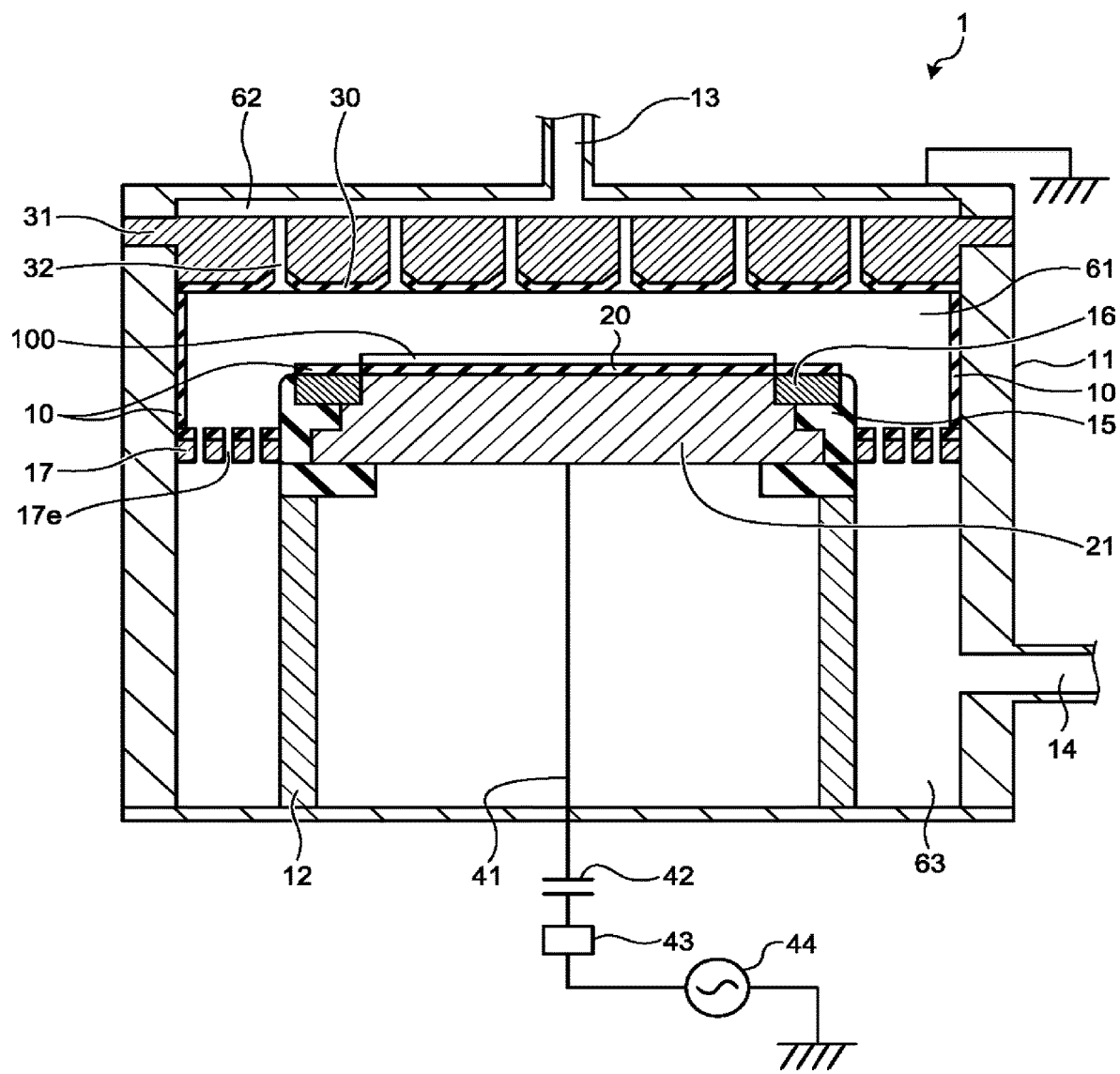
FIG. 1 is a cross-sectional view schematically illustrating an example of a configuration of a plasma processing apparatus according to an embodiment.

FIG. 1 is a cross-sectional view schematically illustrating an example of a configuration of a plasma processing apparatus 1 according to an embodiment. The plasma processing apparatus 1 is configured, for example, as a reactive ion etching (RIE) apparatus that performs plasma etching on a wafer 100 as a substrate.

As illustrated in FIG. 1, the plasma processing apparatus 1 includes a chamber 11 made airtight, for example as a processing container made of aluminum.

A gas supply port 13 is provided in a vicinity of an upper portion of the chamber 11. A gas supply device (not illustrated) is connected to the gas supply port 13 through a pipe so that a processing gas to be used at the time of plasma processing is supplied.

A shower head 31 as a gas supply member functioning as an upper electrode is provided in the vicinity of the upper portion of the chamber 11 below the gas supply port 13. The shower head 31 is provided with a plurality of gas flow paths 32 penetrating in a thickness direction of its' plate. The processing gas supplied from the gas supply port 13 is introduced into the chamber 11 via the gas flow path 32.

Below the shower head 31, a wafer stage 21 as a substrate mounting table is arranged to oppose the shower head 31. The wafer stage 21 horizontally supports the wafer 100 to be processed and functions as a lower electrode. A loading and unloading port for the wafer 100 (not illustrated) is provided on a side surface of the chamber 11, and the wafer 100 is mounted on the wafer stage 21 inside the chamber 11 by an arm (not illustrated) through the loading and unloading port.

The wafer stage 21 is supported on a support 12 which protrudes in a cylindrical shape vertically upward from a bottom wall in a vicinity of a center of the chamber 11. The support 12 supports the wafer stage 21 so as to oppose the shower head 31 in parallel. In addition, the support 12 supports the wafer stage 21 so as to be positioned in the vicinity of the center of the chamber 11 which is separated from the shower head 31 by a predetermined distance. With such a structure, the shower head 31 and the wafer stage 21 constitute a pair of parallel plate electrodes.

A power feed line 41 supplying high-frequency power is connected to the wafer stage 21. A blocking capacitor 42, a matching unit 43, and a high-frequency power supply 44 are connected to the power feed line 41. High-frequency power of a predetermined frequency is supplied from the high-frequency power supply 44 to the wafer stage 21 at the time of plasma processing.

An insulator ring 15 is arranged on an outer circumference of the wafer stage 21 so as to cover circumferential edges of a side surface and a bottom surface of the wafer stage 21. A focus ring 16 is provided on an upper outer circumference of the wafer stage 21 covered by the insulator ring 15. The focus ring 16 adjusts an electric field such that the electric field is not deflected in the vertical direction (direction perpendicular to a wafer surface) at a circumferential edge of the wafer 100 at the time of etching the wafer 100.

A baffle plate 17 is provided between the insulator ring 15 and a side wall of the chamber 11. The baffle plate 17 has a plurality of gas emission holes 17e penetrating in the thickness direction of its' plate.

A gas exhaust port 14 is provided in the chamber 11 below the baffle plate 17. A vacuum pump, which is an exhausting means (not illustrated), is connected to the gas exhaust port 14 through a pipe.

A region inside the chamber 11 partitioned by the wafer stage 21 and the baffle plate 17 and the shower head 31 is a plasma processing chamber 61. The chamber 11, the wafer stage 21, the focus ring 16, the baffle plate 17, and a portion of the shower head 31 which may be exposed to plasma are coated in the plasma processing chamber 61. That is, an yttria film 10 is provided on an inner wall of the chamber 11 and on upper surfaces of the focus ring 16 and the baffle plate 17. In addition, an yttria film 20 is provided on an upper surface of the wafer stage 21. In addition, an yttria film 30 is provided on a lower surface of the shower head 31. The yttria films 10, 20, and 30 are films containing yttria ($Y_2O_3$) as a main component. Since portions of the respective parts that may be exposed plasma are coated with the yttria films 10, 20, and 30, the respective parts are protected from being consumed by plasma.

An upper region inside the chamber 11 partitioned by the shower head 31 is a gas supply chamber 62. A lower region inside the chamber 11 partitioned by the wafer stage 21 and the baffle plate 17 is a gas exhaust chamber 63.

The wafer 100 to be processed is mounted on the wafer stage 21 at the time of plasma processing of the wafer 100. In addition, the inside of the chamber 11 is evacuated by the vacuum pump (not illustrated) connected to the gas exhaust port 14. When the inside of the chamber 11 reaches a predetermined pressure, the processing gas is supplied to the gas supply chamber 62 from the gas supply device (not illustrated), and the gas is supplied to the plasma processing chamber 61 via the gas flow path 32 of the shower head 31. A high-frequency voltage is applied to the wafer stage 21, which is the lower electrode, in a state where the shower head 31, which is the upper electrode, is grounded, thereby generating plasma inside the plasma processing chamber 61. A potential gradient is generated between the plasma and the wafer 100 on the lower electrode side by self-bias due to the high-frequency voltage, and ions in the plasma are accelerated to the wafer stage 21, whereby anisotropic etching is performed.

Example of Configuration of Shower Head

Figure 2A:
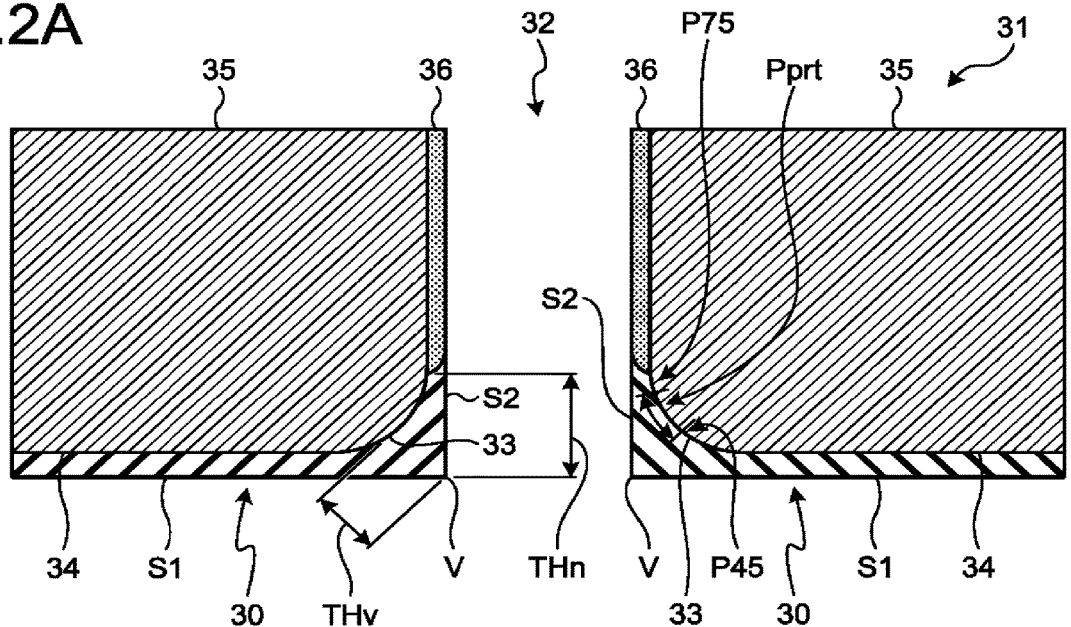
FIG. 2A is an enlarged cross-sectional view illustrating a vicinity of a discharge port of a shower head according to the embodiment.
Figure 2B:
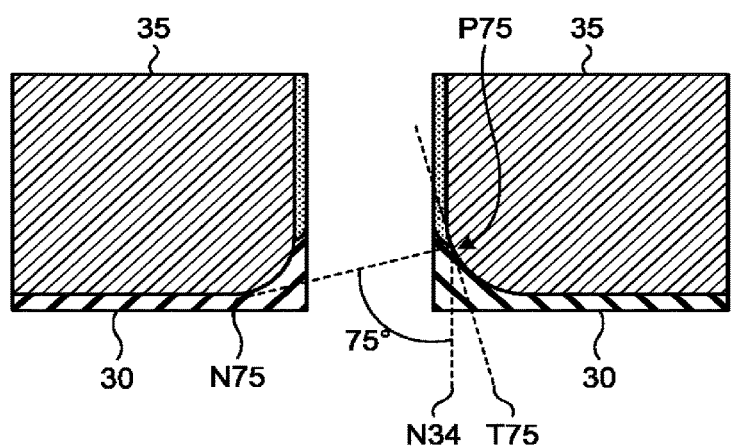
FIG. 2B is an enlarged cross-sectional view illustrating the vicinity of the discharge port of the shower head according to the embodiment.
Figure 2C:
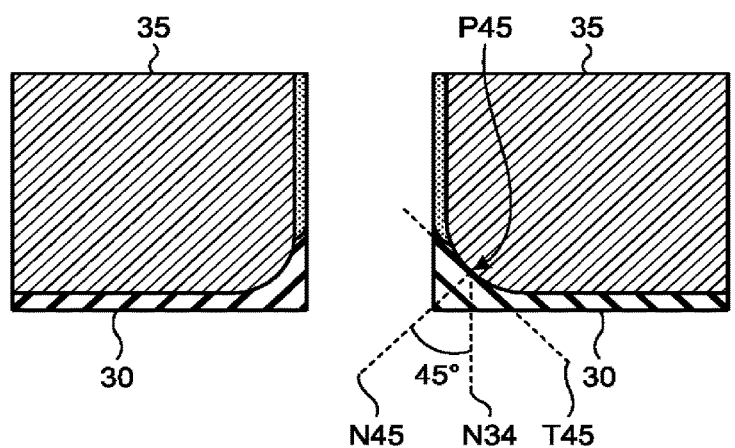
FIG. 2C is an enlarged cross-sectional view illustrating the vicinity of the discharge port of the shower head according to the embodiment.

Next, an example of a configuration of the shower head 31 according to the embodiment will be described in more detail with reference to FIGS. 2A to 2C. FIGS. 2A to 2C are enlarged cross-sectional views illustrating a vicinity of a discharge port 33 of the shower head 31 according to the embodiment.

As illustrated in FIG. 2A, the shower head 31 as the gas supply member includes a base material 35 and an yttria film 30 covering a part of a surface of the base material 35.

The base material 35 is, for example, a disk-shaped member made of aluminum or the like. The base material 35 includes the gas flow path 32, a main surface 34, and the discharge port 33.

The gas flow path 32 is configured to be capable of flowing, from the upstream side to the downstream side, a corrosive gas, an oxidizing gas, a dilution gas, and the like to be plasmatized inside the chamber 11 of the plasma processing apparatus 1. Examples of the corrosive gas include a $C_4F_8$ gas, a $C_4F_6$ gas, a $C_5F_8$ gas, and the like. Examples of the oxidizing gas include an $O_2$ gas, a CO gas, and the like. Examples of the dilution gas include an Ar gas, a He gas, a $N_2$ gas, and the like. In a state where the shower head 31 is installed inside the chamber 11, the upstream side of the gas flow path 32 is the upper surface side of the shower head 31, that is, the side where the gas supply port 13 and the gas supply chamber 62 are provided. The downstream side of the gas flow path 32 is the lower surface side of the shower head 31, that is, the plasma processing chamber 61 side, in the state where the shower head 31 is installed inside the chamber 11.

The surface of the base material 35 of the gas flow path 32 is covered with, for example, an aluminum oxide $Al_2O_3$) film 36.

The main surface 34 is arranged on the downstream side of the gas flow path 32. That is, the main surface 34 is the lower surface of the shower head 31 opposing the wafer stage 21 in the state where the shower head 31 is installed inside the chamber 11. The main surface 34 extends in a direction intersecting an extending direction of the gas flow path 32, the direction including a direction orthogonal to the extending direction of the gas flow path 32.

The discharge port 33 is a portion which connects the gas flow path 32 and the main surface 34 which are arranged in directions intersecting each other. A surface of the discharge port 33 has, for example, a curved shape extending from the main surface 34 to the gas flow path 32. In other words, the discharge port 33 is a portion having a curvature in which a corner where the gas flow path 32 and the main surface 34 intersect each other is shaved.

Since the discharge port 33 is formed in the curved shape, the discharge port 33 continuously has a plurality of surface orientation portions each having a normal intersecting a normal of the main surface 34 at 0° to 90°. An angle at which the normal of an arbitrary surface orientation portion on the surface of the discharge port 33 intersects the normal of the main surface 34 is an angle formed between a normal to a tangent at a point (portion) having an arbitrary orientation of the curved surface of the discharge port 33 and the normal of the main surface 34. Such a state is illustrated in FIGS. 2B and 2C.

As illustrated in FIG. 2B, an angle formed between a normal N75 to a tangent T75 of a certain surface orientation portion P75 of the surface of the discharge port 33 and a normal N34 to the main surface 34 is 75°. More specifically, the surface orientation portion P75 is an outline along each point (portion) that has a surface orientation having the normal intersecting the normal of the main surface 34 at 75°.

As illustrated in FIG. 2C, an angle formed between a normal N45 to a tangent T45 of another surface orientation portion P45 of the surface of the discharge port 33 and the normal N34 to the main surface 34 is 45°. More specifically, the surface orientation portion P45 is an outline along each point (portion) that has a surface orientation having the normal intersecting the normal of the main surface 34 at 45°.

As illustrated in FIG. 2A, the curved surface within the range of the surface orientation portion P45 to the surface orientation portion P75 of the discharge port 33 is referred to as a protection target surface Pprt. The protection target surface Pprt is, for example, a ring-shaped surface which exists around the entire circumference of the discharge port 33 formed in a cylindrical shape.

The yttria film 30 covers the main surface 34 of the base material 35 and the surface of the discharge port. 33. However, the yttria film 30 may also cover a part of the gas flow path 32, more specifically, a part of the aluminum oxide film 36 covering the gas flow path 32.

The yttria film 30 has a substantially uniform film thickness of, for example, equal to or more than 250 μm and less than 300 μm on the main surface 34. Since the film thickness of the yttria film 30 is set to, for example, 250 μm or more, it is possible to obtain a sufficient plasma resistance in the shower head 31. Since the film thickness of the yttria film 30 is set to, for example, less than 300 μm, it is possible to prevent the electric field in the plasma from changing due to the influence of the yttria film 30 and affecting processing characteristics of the wafer 100.

Since the yttria film 30 has the substantially uniform film thickness on the main surface 34, the yttria film 30 has a first surface S1 extending in a direction along the main surface 34, the direction including a direction substantially parallel to the main surface 34. The first surface S1 of the yttria film 30 extends onto the discharge port 33, and the film thickness of the yttria film 30 also increases as the discharge port 33 curves toward the gas flow path 32. Incidentally, the film thickness of the yttria film 30 on the discharge port 33 can be defined as, for example, a thickness in a normal direction of a tangent with respect to the curved surface of the discharge port 33.

In a vicinity of a connection portion of the discharge port 33 with the gas flow path 32, the yttria film 30 has substantially the same film thickness as the aluminum oxide film 36 covering the surface of the gas flow path 32. Accordingly, the yttria film 30 has a second surface S2 extending in a direction along the extending direction of the gas flow path 32, the direction including a direction substantially parallel to the extending direction of the gas flow path 32. The second surface S2 of the yttria film 30 extends to a predetermined position on the discharge port 33, and the film thickness of the yttria film 30 also increases as the discharge port 33 curves toward the main surface 34.

The first surface S1 and the second surface S2 of the yttria film 30 extend on the discharge port 33, and intersect each other at a predetermined position on the protection target surface Pprt of the discharge port 33, for example. Accordingly, the yttria film 30 has an apex angle V, formed by the intersection between the first surface S1 and the second surface S2, on the protection target surface Pprt of the discharge port 33. The apex angle V exists in a ring shape, for example, around the entire circumference of the discharge port 33 formed in the cylindrical shape. An angle of the apex angle V is, for example, substantially equal to an angle at which the main surface 34 intersects the extending direction of the gas flow path 32. The film thickness of the yttria film 30 is maximized at the apex angle V on the protection target surface Pprt.

In the example of FIG. 2A, the first surface S1 and the second surface S2 of the yttria film 30 intersect each other, for example, on the surface orientation portion P45 of the surface of the discharge port 33. Accordingly, the yttria film 30 has the substantially perpendicular apex angle V, for example, on the surface orientation portion P45 of the surface of the discharge port 33. A film thickness THv of the yttria film 30 at the apex angle V, that is, the film thickness of the surface orientation portion P45 in the normal direction is maximized to, for example, about 500 μm. In addition, a film thickness THn of the yttria film 30 at the apex angle V measured in the normal direction of the main surface 34 is, for example, 800 μm to 1200 μm.

In this manner, the yttria film 30 on the discharge port 33 has a shape different from a shape of the surface of the discharge port 33. Accordingly, the yttria film 30 covers the main surface 34 and the surface of the discharge port 33 such that the surface of the yttria film 30 has no surface orientation portion of which a normal intersects the normal of the main surface 34 at 45° to 75°.

Example of Process of Forming Yttria Film

Figure 3A:
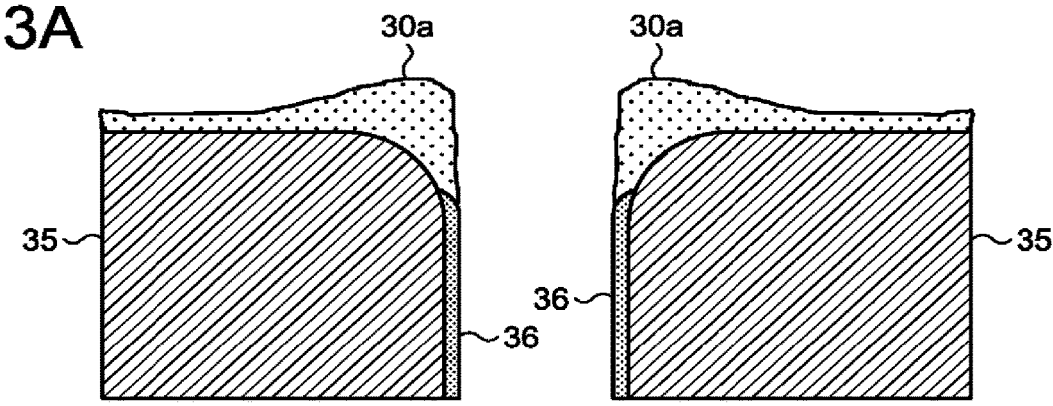
FIG. 3A is an enlarged cross-sectional view illustrating an example of a procedure of a process of forming an yttria film according to the embodiment.
Figure 3B:
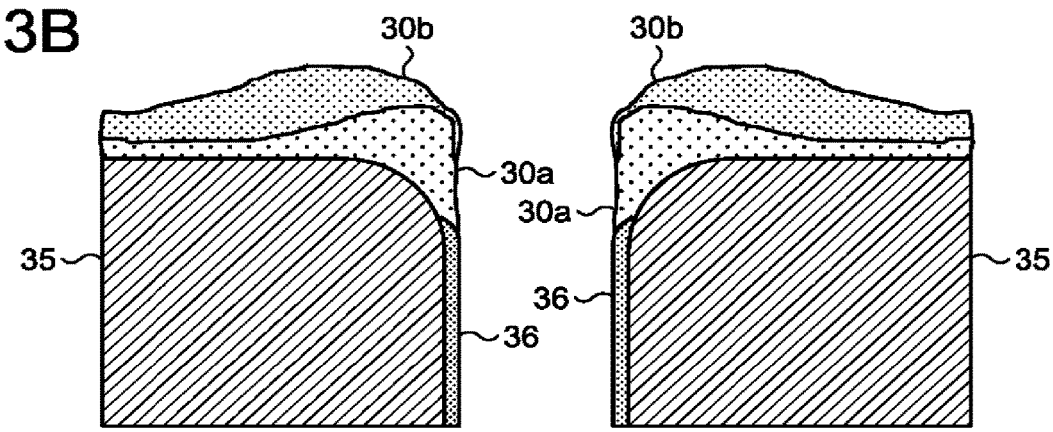
FIG. 3B is an enlarged cross-sectional view illustrating an example of the procedure of the process of forming the yttria film according to the embodiment.
Figure 3C:
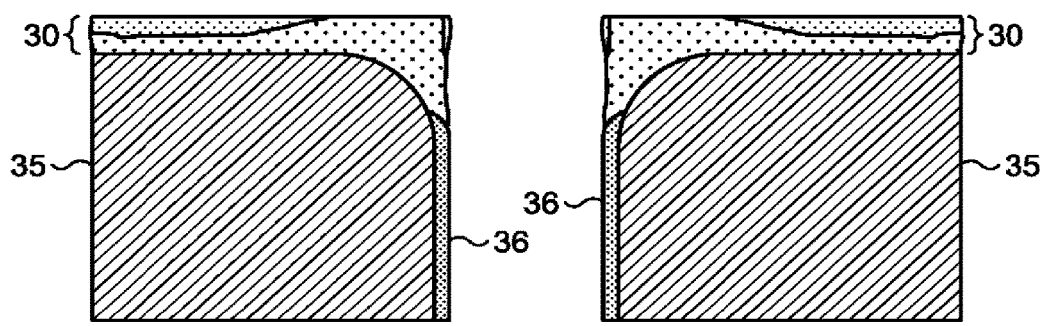
FIG. 3C is an enlarged cross-sectional view illustrating an example of the procedure of the process of forming the yttria film according to the embodiment.

Next, an example of a process of forming the yttria film 30 provided in the shower head 31 will be described with reference to FIGS. 3A to 3C. FIGS. 3A to 3C are enlarged cross-sectional views illustrating examples of procedures of the process of forming the yttria film 30 according to the embodiment.

First, the base material 35 of the shower head 31 is prepared. The base material 35 can be formed as follows. The gas flow path 32 is formed in an aluminum material or the like on a disk so as to penetrate through the aluminum material in the thickness direction. The corner where the main surface 34 of the aluminum ma intersects the gas flow path 32 is curved to form the discharge port 33. The aluminum oxide film 36 is formed on the main surface 34 of the aluminum material, the surface of the discharge port 33, the inner surface of the gas flow path 32, and the like by anodic oxidation or the like. The aluminum oxide film 36 on the main surface 34 and the discharge port 33 is removed. Since the aluminum oxide film 36 on the main surface 34 and the discharge port 33 on which the yttria film 30 is to be formed is removed, the adhesion of the yttria film 30 with respect to the base material 35 is improved.

As illustrated in FIG. 3A, yttria plasma spraying is performed on the base material 35, prepared as described above, at atmospheric pressure while mainly targeting the discharge port 33. At this time, for example, a plasma spray gun is inclined to the perpendicular to the surface orientation portion P45 of the surface of the discharge port 33, and inclined spraying is performed with a target film thickness of, for example, 30 μm to 300 μm so that the top of the discharge port 33 is preferentially coated with yttria over the top of the main surface 34. Accordingly, a first yttria film 30a in which a film thickness on the surface of the discharge port 33 is thicker than a film thickness on the main surface 34 is formed.

As illustrated in FIG. 3A, yttria plasma spraying is performed on the base material 35 on which the first yttria film 30a has been formed at atmospheric pressure while mainly targeting the main surface 34. At this time, for example, a plasma spray gun is directed to be perpendicular to the main surface 34, and vertical spraying performed with a target film thickness of, for example, 800 μm to 1800 μm so that the top of the main surface 34 is preferentially coated with yttria over the top of the discharge port 33. As a result, a second yttria film 30b in which a film thickness on the main surface 34 is thicker than a film thickness on the surface of the discharge port 33 is formed on the first yttria film 30a.

As illustrated in FIG. 3C, the yttria films 30a and 30b are polished from the main surface 34 side with a target lower limit film thickness on the main surface 34 of, for example, about 250 μm. Accordingly, it is possible to obtain the yttria film 30 whose surface on the main surface 34 side is formed to extend in the direction along the main surface 34. The yttria film 30 is constituted by, for example, the yttria films 30a and 30b, but the second yttria film 30b may be completely polished away. When the yttria films 30a and 30b are mixed in the yttria film 30, an interface between the yttria films 30a and 30b may be present or absent. Even when the interface between the yttria films 30a and 30b is present, the interface is not observed in some cases.

In the plasma spraying, the surface vertically opposing the plasma spray gun is preferentially coated. In the shower head 31 of the embodiment, the process of FIG. 3A is performed to form the first yttria film 30a such that the film thickness on the discharge port 33 becomes thicker. However, the film thickness of the first yttria film 30a is not sufficiently obtained on the main surface 34 in the process of FIG. 3A. Therefore, the process of FIG. 3B is further performed to form the yttria film 30 having the sufficient film thickness even on the main surface 34.

Sputtering Yield

In a plasma processing apparatus, a CF-based corrosive gas is used as a plasma processing gas in some cases. There is a case where parts inside a chamber are coated with a protective film such as yttria in order to protect the parts inside the chamber from the plasma of such a corrosive gas and extend each life of the parts.

When an yttria film is formed along a curved surface of a discharge port on a base material of a shower head having the curved discharge port, the yttria film on the discharge port is consumed faster than the yttria film on a main surface, and the yttria film partially disappears in a portion to expose the base material in some cases. The consumption of the yttria film in the plasma processing apparatus is known to occur based on a plasma attack to the yttria film, in other words, a sputtering phenomenon of the yttria film caused by ions in the plasma. At this time, the yttria film is consumed in each portion on the discharge port, at a rate depending on an angle at which each sputtering component is drawn to the surface of the yttria film.

Figure 4:
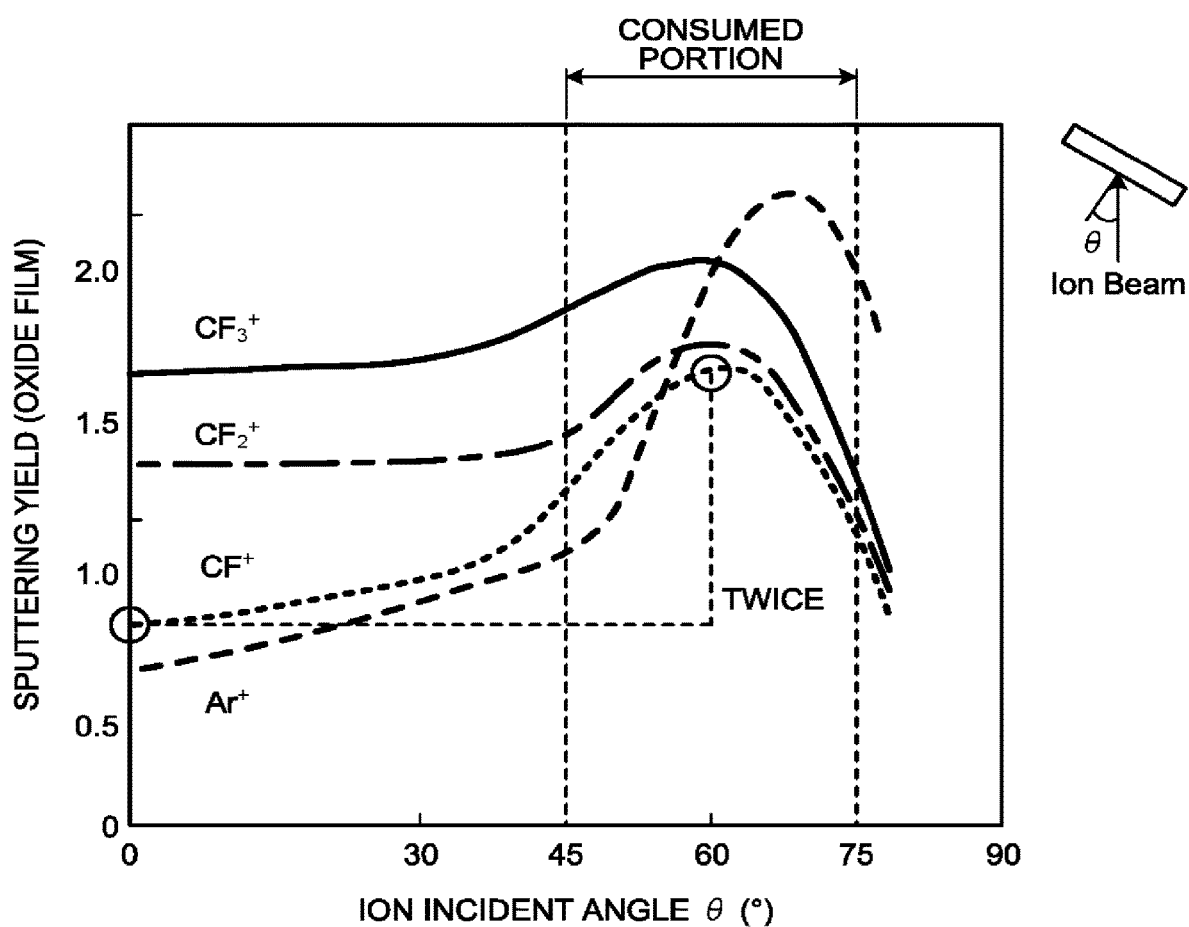
FIG. 4 is a graph illustrating a relationship between an ion incident angle and a sputtering yield.

FIG. 4 is a graph illustrating a relationship between an ion incident angle and a sputtering yield. The horizontal axis of the graph of FIG. 4 represents the ion incident angle θ (°) with respect to an oxide film member, and the vertical axis represents the sputtering yield of the oxide film member. In any of $Ar^+$ ions, $CF^+$ ions, $CF_2^+$ ions, and $CF_3^+$ ions, the sputtering yield increases when the ion incident angle θ with respect to the oxide film member is in the range of 45° to 75°. When the ion incident angle θ is compared between 0° and 60°, at 60°, the sputtering yield becomes twice that at 0°.

As described above, ions in plasma mainly reach the wafer stage side due to the potential gradient between the plasma and the wafer in the plasma processing apparatus. However, some ions are also directed to the shower head side. Assuming that the ion incident angle at this time is a normal direction of the main surface of the shower head, particularly a portion on the surface of the discharge port where the yttria film is consumed is considered to be a surface orientation portion of which a normal intersects the normal of the main surface of the shower head at 45° to 75°, on the surface of the yttria film along the curved surface of the discharge port.

According to the shower head 31 of the embodiment, the yttria film 30 covers the main surface 34 and the surface of the discharge port 33 such that the surface of the yttria film 30 has no surface orientation portion of which a normal intersects the normal of the main surface 34 at 45° to 75°. Accordingly, the consumption of the yttria film 30 on the protection target surface Pprt within the range of the surface orientation portion P45 to the surface orientation portion P75 is suppressed in the discharge port 33, and it is possible to improve protection performance against plasma. Therefore, the corrosion of the base material 35 of the shower head 31 is suppressed, and the life of the shower head 31 is extended.

According to the shower head 31 of the embodiment, the yttria film 30 has the apex angle V on the protection target surface Pprt within the range of the surface orientation portion P45 to the surface orientation portion P75 in the discharge port 33, for example, on the surface orientation portion P45 of which a normal intersects the normal of the main surface 34 at 45°, and has the maximum film thickness on the surface orientation portion P45. As a result, it is possible to more reliably protect the protection target surface Pprt of the discharge port 33 which is severely consumed by the ion sputtering.

According to the shower head 31 of the embodiment, the yttria film 30 is formed by the process of forming the first yttria film 30a in FIG. 3A and the process of forming the second yttria film 30b in FIG. 3B. Since the yttria film 30 is formed by combining the yttria films 30a and 30b, the film thickness of the yttria film 30 on the protection target surface Pprt of the discharge port 33 can be made thicker than that of the other portion.

According to the shower head 31 of the embodiment, the discharge port 33 of the base material 35 is formed in the curved shape including the protection target surface Pprt. With the discharge port 33 configured as above, stress of the yttria film 30 is relieved as compared with a case where the main surface 34 and the gas flow path 32 have corners, and it is possible to suppress generation of a crack in the yttria film 30.

Modification

Figure 5:
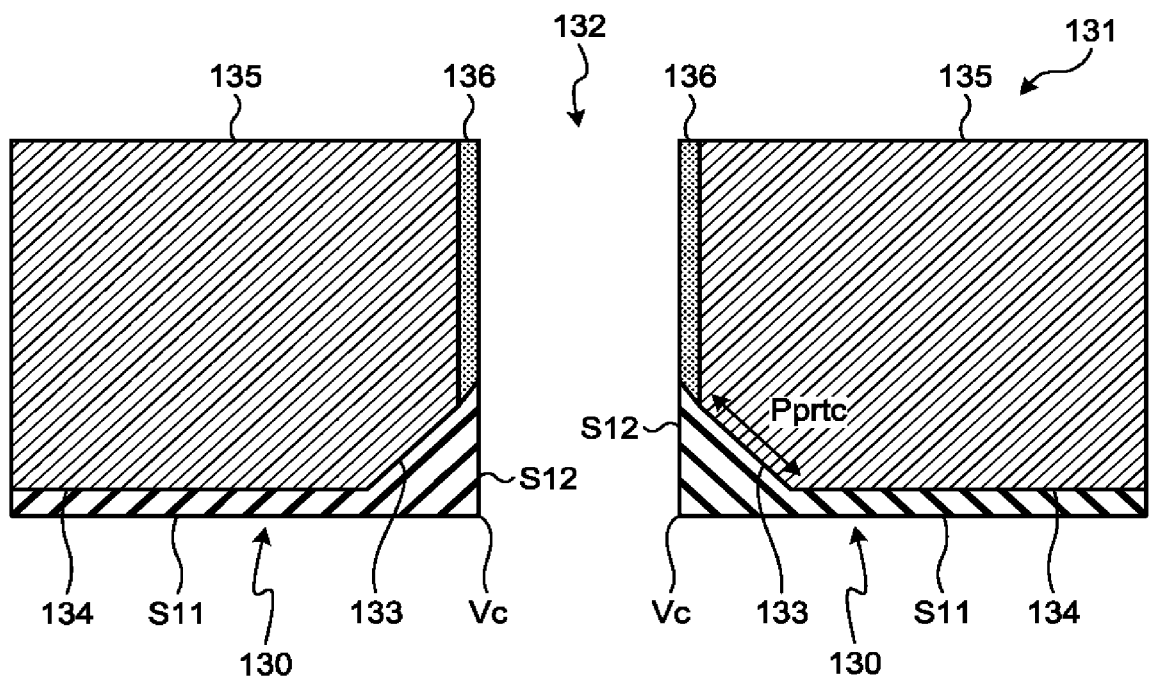
FIG. 5 is an enlarged cross-sectional view illustrating a vicinity of a discharge port of a shower head according to a modification of the embodiment.

Next, a shower head 131 according to a modification of the embodiment will be described with reference to FIG. 5. FIG. 5 is an enlarged cross-sectional view illustrating a vicinity of a discharge port 133 of the shower head 131 according to the modification of the embodiment. The shower head 131 of the modification differs from the shower head 31 of the embodiment in terms of a shape of the discharge port 133.

As illustrated in FIG. 5, the shower head 131 of the modification includes a base material 135 and an yttria film 130 covering a part of the base material 135.

The base material 135 includes: a gas flow path 132 whose inner wall covered with an aluminum oxide film 136; a main surface 134 arranged in a direction intersecting an extending direction of the gas flow path 132; and a planar discharge port 133 connecting the gas flow path 132 and the main surface 134. That is, the discharge port 133 is a portion in which a corner formed by an intersection between the gas flow path 132 and the main surface 134 is chamfered.

A plane of the discharge port 133 is inclined with respect to the main surface 134, and an angle of the inclination, that is, an angle at which a normal of the plane of the discharge port 133 intersects a normal of the main surface 34 falls within the range of, for example, 45° to 75°. That is, in the shower head 131 of the modification, the discharge port 133 has a surface orientation portion of which a normal intersects the normal of the main surface 134 at 45° to 75°, on the entire surface thereof. In addition, the entire surface of the discharge port 133 is a protection target surface Pprtc in the shower head 131 of the modification.

The yttria film 130 has a first surface S11 extending in a direction along the main surface 134; a second surface S12 extending in a direction along the extending direction of the gas flow path 132; and an apex angle Vc formed by an intersection of the surfaces S11 and S12. A film thickness of the yttria film 130 is maximized at the apex angle Vc on the protection target surface Pprtc.

In the shower head 131 of the modification, the yttria film 130 is formed by the same process as the above-described embodiment. In other words, a plasma spraying gun is inclined to be perpendicular to the discharge port 133 inclined at a predetermined angle, whereby the top of the discharge port 133 is coated thickly with yttria.

Even in the shower head 131 of the modification, the yttria film 130 covers the main surface 134 and the surface of the discharge port 133 such that the surface of the yttria film 130 has no surface orientation portion of which a normal intersects the normal of the main surface 134 at 45° to 75°. Accordingly, it is possible to improve protection performance against plasma.

Even in the shower head 131 of the modification, the main surface 134 and the gas flow path 132 are connected at a gentle angle (obtuse angle) by the discharge port 133 so that it is possible to suppress generation of a crack or the like in the yttria film 130.

Other Modifications

Although the yttria films 30 and 130 are formed by the plasma spraying in the above-described embodiment and the like, an embodiment is not limited thereto. The yttria film can be also formed by another method, for example, chemical vapor deposition (CVD), aerosol deposition, cold spray, gas deposition, electrostatic particle impact coating, impact sintering, or the like.

Although the yttria films 30 and 130 are used as the coating films of the shower heads 31 and 131 in the above-described embodiment and the like, an embodiment is not limited thereto. The coating film of the shower head may be, for example, an yttrium oxyfluoride (YOF, $Y_5O_4F_7$) film, a yttrium fluoride ($YF_3$) film, an alumina (aluminum oxide) film, an aluminum nitride (AlN) film, or the like other than the yttria film. As a coating film containing at least one of the films is formed into the same shape as the yttria films 30 and 130 in the above-described embodiment and the like, the same effects as the above-described embodiment and the like are obtained.

Although the shower heads 31 and 131 are mounted on the plasma processing apparatus 1 configured as the RIE apparatus in the above-described embodiment and the like, an embodiment is not limited thereto. The plasma processing apparatus may be an apparatus that performs plasma processing other than a reactive ion etching, such as a chemical dry etching (CDE) apparatus, a CVD apparatus, and an aching apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gas supply member comprising:
a base material that has:
a gas flow path capable of flowing a gas from an upstream side to a downstream side,
a main surface arranged on the downstream side of the gas flow path in a direction intersecting an extending direction of the gas flow path, and
a discharge port connecting the gas flow path and the main surface; and
a film that contains at least one of yttria, yttrium oxyfluoride, yttrium fluoride, alumina, and aluminum nitride and covers the main surface and a surface of the discharge port of the base material,
wherein the film covers the main surface and the surface of the discharge port such that a surface of the film does not have a surface orientation portion of which a normal intersects a normal of the main surface at 45° to 75°.

2. The gas supply member according to claim 1, wherein the discharge port has a curved or planar surface between the main surface and the gas flow path, and
the film covering the surface of the discharge port has:
a first face extending in a direction along the main surface;
a second face extending in a direction along the extending direction of the gas flow path; and
an apex angle formed by an intersection of the first surface and the second surface.

3. The gas supply member according to claim 2, wherein the surface of the discharge port has a surface orientation portion having a normal intersecting the normal of the main surface at 45° to 75°, and
a film thickness of the film is maximized on the surface orientation portion of the surface of the discharge port.

4. The gas supply member according to claim 3, wherein the apex angle of the film is arranged on the surface orientation portion of the surface of the discharge port.

5. The gas supply member according to claim 1, wherein the film is an yttria film.

6. A gas supply member comprising:
a base material that has:
a gas flow path capable of flowing a gas from an upstream side to a downstream side,
a main surface arranged on the downstream side of the gas flow path in a direction intersecting an extending direction of the gas flow path, and
a discharge port connecting the gas flow path and the main surface; and
a film that contains at least one of yttria, yttrium oxyfluoride, yttrium fluoride, alumina, and aluminum nitride and covers the main surface and a surface of the discharge port of the base material,
wherein the surface of the discharge port has a surface orientation portion having a normal intersecting a normal of the main surface at 45° to 75°,
a film thickness of the film is maximized on the surface orientation portion of the surface of the discharge port, and
wherein the discharge port has a curved or planar surface between the main surface and the gas flow path, and
the film covering the surface of the discharge port has:
a first surface extending in a direction along the main surface;

a second surface extending in a direction along the extending direction of the gas flow path; and an apex angle formed by an intersection of the first surface and the second surface.

7. The gas supply member according to claim 6, wherein the apex angle or the film is arranged on the surface orientation portion of the surface of the discharge port.

8. The gas supply member according to claim 6, wherein the film is an yttria film.

9. A plasma processing apparatus comprising:
a processing container in which a substrate is processed;
a power supply which supplies power into the processing container to generate plasma;
a substrate mounting table on which the substrate is mounted; and
the gas supply member according to claim 1 which is arranged to oppose the substrate mounting table.

10. The plasma processing apparatus according to claim 9, wherein
the surface of the discharge port has a surface orientation portion having a normal intersecting the normal of the main surface at 45° to 75°, and
a film thickness of the film is maximized on the surface orientation portion of the surface of the discharge port.

11. The plasma processing apparatus according to claim 9, wherein
the discharge port has a curved or planar surface between the main surface and the gas flow path, and
the film covering the surface of the discharge port has:
a first surface extending in a direction along the main surface;
a second surface extending in a direction along the extending direction of the gas flow path; and
an apex angle formed by an intersection of the first surface and the second surface.

12. The plasma processing apparatus according to claim 9, wherein
the film is an yttria film.

13. A plasma processing apparatus comprising:
a processing container in which a substrate is processed;
a power supply which supplies power into the processing container to generate plasma;
a substrate mounting table on which the substrate is mounted; and
the gas supply member according to claim 6 which is arranged to oppose the substrate mounting table.

14. The plasma processing apparatus according to claim 13, wherein
the film is an yttria film.

15. A method for forming a coating film on a base material,
the base material having a gas flow path capable of flowing a gas, a main surface arranged in a direction intersecting an extending direction of the gas flow path, and a discharge port connecting the gas flow path and the main surface,
the coating film containing at least one of yttria, yttrium oxyfluoride, yttrium fluoride, alumina, and aluminum nitride and covering the main surface and a surface of the discharge port of the base material, the method comprising:
forming a first film which contains at least one of yttria, yttrium oxyfluoride, yttrium fluoride, alumina, and aluminum nitride and has a film thickness on the surface of the discharge port thicker than a film thickness on the main surface;
forming a second film on the first film, the second film containing at least one of yttria, yttrium oxyfluoride, yttrium fluoride, alumina, and aluminum nitride and having a film thickness on the main surface thicker than a film thickness on the surface of the discharge port;
polishing the first film and the second film from a side of the main surface to form the coating film such that a surface of the coating film extends in a direction along the main surface on the side of the main surface; and
the coating film covers the main surface and the surface of the discharge port such that the surface of the coating film does not have a surface orientation portion of which a normal intersects a normal of the main surface at 45° to 75°.

16. The method for forming a coating film according to claim 15, wherein
the surface of the discharge port has a surface orientation portion having a normal intersecting a normal of the main surface at 45° to 75°, and
a film thickness of the coating film is maximized on the surface orientation portion of the surface of the discharge port.

17. The method for forming a coating film according claim 15, wherein
the coating film is an yttria film.

* * * * *